(12) United States Patent
Kishino

(10) Patent No.: US 10,614,853 B2
(45) Date of Patent: Apr. 7, 2020

(54) STORAGE DEVICE AND CONTROLLER

(71) Applicant: KABUSHIKI KAISHA TOSHIBA, Tokyo (JP)

(72) Inventor: Keiichi Kishino, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 24 days.

(21) Appl. No.: 15/694,971

(22) Filed: Sep. 4, 2017

(65) Prior Publication Data

US 2018/0277158 A1    Sep. 27, 2018

(30) Foreign Application Priority Data

Mar. 23, 2017    (JP) .................................. 2017-057951

(51) Int. Cl.

| G11B 20/14 | (2006.01) |
|---|---|
| G11B 20/18 | (2006.01) |
| H03M 13/11 | (2006.01) |
| G11B 20/10 | (2006.01) |
| H03M 13/33 | (2006.01) |

(Continued)

(52) U.S. Cl.
CPC .......... *G11B 20/1403* (2013.01); *G11B 20/10* (2013.01); *G11B 20/1833* (2013.01); *G11B 27/3027* (2013.01); *H03M 13/1105* (2013.01); *H03M 13/333* (2013.01); *G11B 2020/1287* (2013.01); *G11B 2020/183* (2013.01); *G11B 2020/185* (2013.01)

(58) Field of Classification Search
CPC . G11B 20/1403; G11B 20/1833; G11B 20/10; G11B 27/3027; G11B 2020/183; G11B 2020/1287; G11B 2020/185; H03M 13/1105; H03M 13/333
USPC ........................................................ 714/758
See application file for complete search history.

(56) References Cited

U.S. PATENT DOCUMENTS

| 6,048,090 A | * | 4/2000 | Zook ................. G11B 20/1833 |
|---|---|---|---|
| | | | 714/755 |
| 6,557,113 B1 | | 4/2003 | Wallentine et al. |

(Continued)

FOREIGN PATENT DOCUMENTS

CN          102163464 A      8/2011

OTHER PUBLICATIONS

Office Action dated Nov. 6, 2019 in corresponding Chinese Patent Application No. 201810054375.4, 11 pages. (No English translation available).

*Primary Examiner* — James C Kerveros
(74) *Attorney, Agent, or Firm* — Kim & Stewart LLP

(57) ABSTRACT

A storage device includes a recording medium, a first memory storing first data read from the recording medium, and a controller. The controller searches for read target data in the first data by executing a parity check on second data that is in the first data and starts at a first position, while executing the parity check, determining whether or not an interruption condition is satisfied, storing the second data in a second memory when the parity check completes without the interruption condition being satisfied and a result of a completed parity check satisfies a first condition, and executing a parity check on third data that is in the first data and starts at a second position, responsive to the interruption condition being satisfied and responsive to the result of the completed parity check not satisfying the first condition.

17 Claims, 13 Drawing Sheets

(51) Int. Cl.
  *G11B 27/30*  (2006.01)
  *G11B 20/12*  (2006.01)

(56) References Cited

U.S. PATENT DOCUMENTS

| | | | |
|---|---|---|---|
| 8,345,369 B2* | 1/2013 | Xia | G11B 5/59616 |
| | | | 360/48 |
| 8,413,010 B1* | 4/2013 | Vasquez | H03M 13/3746 |
| | | | 714/758 |
| 8,730,606 B1* | 5/2014 | Tan | G11B 20/10046 |
| | | | 360/46 |
| 8,731,115 B2* | 5/2014 | Yang | G11B 20/10046 |
| | | | 375/229 |
| 8,788,921 B2* | 7/2014 | Chang | H03M 13/2957 |
| | | | 714/792 |
| 9,047,882 B2* | 6/2015 | Pan | G11B 5/012 |
| 9,244,752 B2* | 1/2016 | Qin | H03M 13/03 |
| 2001/0010604 A1 | 8/2001 | Esumi | |
| 2007/0103806 A1* | 5/2007 | Esumi | G11B 20/10 |
| | | | 360/39 |
| 2007/0297079 A1* | 12/2007 | Motwani | G11B 20/1217 |
| | | | 360/51 |
| 2008/0144207 A1* | 6/2008 | Sai | G11B 20/10009 |
| | | | 360/69 |
| 2008/0144454 A1* | 6/2008 | Bottemiller | G11B 5/09 |
| | | | 369/47.14 |
| 2010/0306617 A1 | 12/2010 | Kondo et al. | |
| 2011/0205653 A1 | 8/2011 | Mathew et al. | |
| 2012/0198304 A1* | 8/2012 | Kondo | G11B 20/1833 |
| | | | 714/758 |
| 2013/0003209 A1* | 1/2013 | Kishino | G11B 5/09 |
| | | | 360/29 |
| 2018/0277158 A1* | 9/2018 | Kishino | G11B 20/1403 |

* cited by examiner

STORAGE DEVICE AND CONTROLLER

This application is based upon and claims the benefit of priority from Japanese Patent Application No. 2017-057951, filed Mar. 23, 2017, the entire contents of which are incorporated herein by reference.

FIELD

Embodiments described herein relate generally to a storage device and a controller.

BACKGROUND

As an example of a storage device, there is a magnetic disk device (e.g., hard disk drive). As an example of an error generated in the magnetic disk device, there is a read error based on a Sync-Mark detection error.

DETAILED DESCRIPTION

Figure 1:
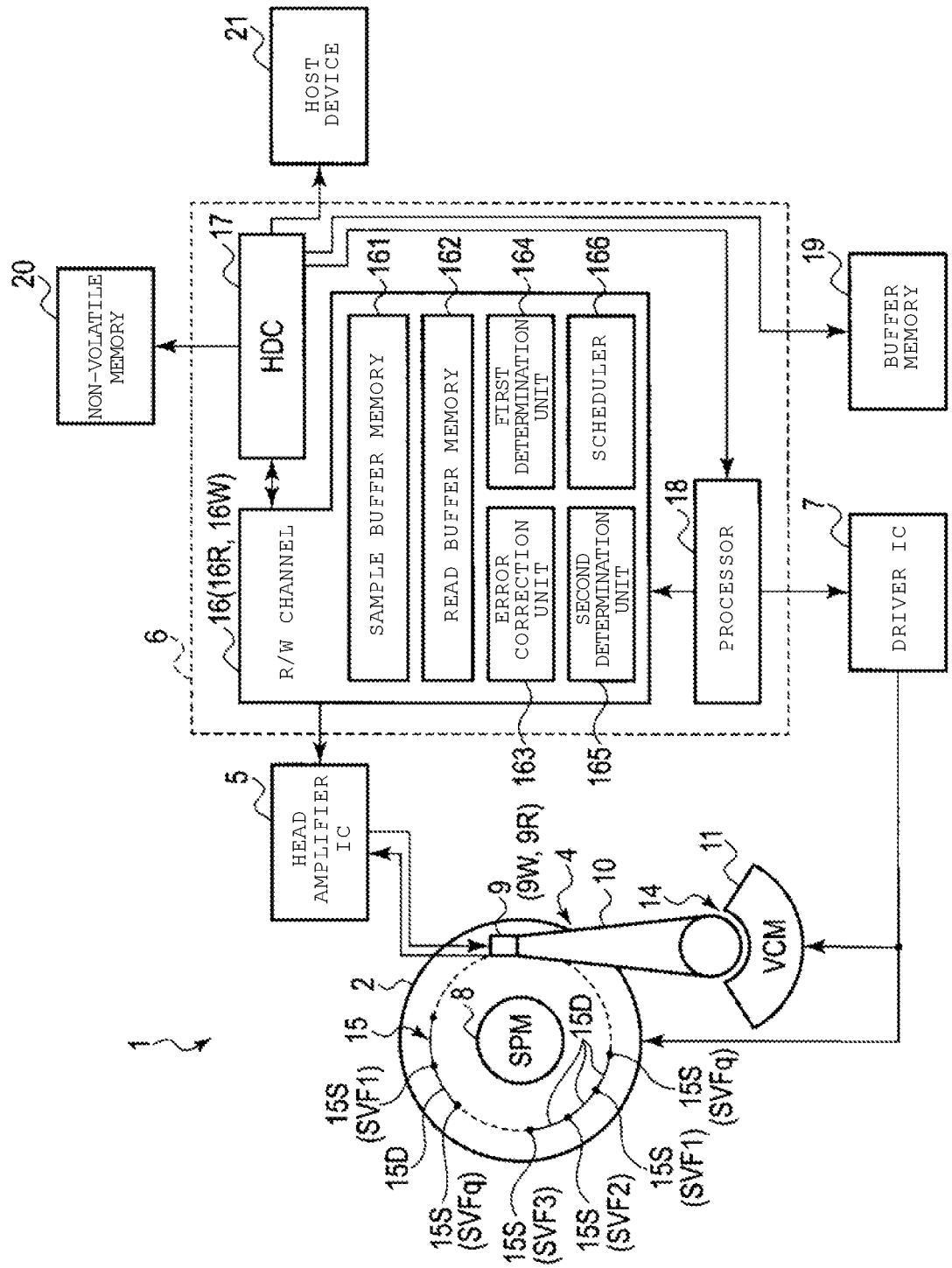
FIG. 1 is a block diagram illustrating an example of a storage device according to a first embodiment.

Embodiments provide a storage device that shortens a recovery time for a read error and a controller configured to perform the same.

According to one embodiment, there is provided a storage device including a recording medium, a first memory, and a controller circuit. The first memory stores first data read from the recording medium. The controller circuit is configured to search for read target data in the first data by executing a parity check on second data that is included in the first data and starts at a first offset from a head position of the first data, while executing the parity check on the second data, determining whether or not an interruption condition is satisfied, storing the second data in a second memory when the parity check executed on the second data completes without the interruption condition being satisfied and a result of a completed parity check executed on the second data satisfies a first condition, and executing a parity check on third data that is included in the first data and starts at a second offset from the head position of the first data, responsive to the interruption condition being satisfied and responsive to the result of the completed parity check executed on the second data not satisfying the first condition.

In the following disclosure, respective embodiments will be described with reference to the drawings. In the following description, approximately or substantially the same function or components are assigned the same reference numerals and descriptions thereof will be omitted, and description will be made as needed.

In the following respective embodiments, a demodulation (or "decoding") technique for a storage device will be described. In the various embodiments, descriptions are made with respect to a magnetic disk device as a representative example of a storage device. However, the various embodiments can also be similarly applied to other kinds of storage devices such as an optical disk device or a magneto-optical disk device.

First Embodiment

In the first embodiment, a storage device is configured to determine whether an interruption condition in a repetitive decoding (e.g., iterative decoding) process is satisfied or not. The interruption condition is based on a parity violation number when decoding target data. The storage device is further configured to interrupt decoding when the interruption condition is satisfied. In the first embodiment, data includes a plurality of data segments that are each capable of undergoing a parity check in addition to parity data for each data segment. When executing the parity check for decoding target data, the number of bits employed to determine that a result of the parity check is an error is defined as a parity violation number.

In the first embodiment, for example, the storage device may interrupt decoding when the parity violation number during decoding is greater than or equal to a threshold value. Alternatively or additionally, the storage device may interrupt decoding when a pattern of the plurality of parity violation numbers calculated during decoding is a specific pattern.

In the first embodiment, as one example, a position of data or a sample value is specified at the time when data or the sample value is read or detected. However, the position of data or the sample value may be specified by, for example, (1) a position when data or the sample value is stored in a memory, or (2) a difference (i.e., an offset value) between a reference position and the position where data or the sample value is stored in the memory. In the first embodiment, the interruption condition not being satisfied in the repetitive decoding is considered an execution condition for executing decoding.

FIG. 1 is a block diagram illustrating an example of a storage device 1 according to a first embodiment. In the storage device 1, position information is divided into segments, and the divided segments of position information are recorded in a plurality of servo areas (or servo frames) 15S.

The storage device 1 includes a head-disk assembly (HDA) 4, a head amplifier integrated circuit (IC) 5, a main controller 6, a driver IC 7, a buffer memory 19, and a non-volatile memory 20.

The HDA 4 includes a disk 2 which is a recording medium, a spindle motor (SPM) 8, an arm 10 installed with a head 9, and a voice coil motor (VCM) 11. The disk 2 is rotated by the spindle motor 8. The arm 10 and the VCM 11 constitute an actuator 14 and move (seek) the head 9 to a target position on the disk 2. That is, the actuator 14 moves the head 9 installed on the arm 10 in the radial direction on the disk 2 when driven by the VCM 11. Driving of the VCM 11 is controlled by a current or voltage from the driver IC 7.

The disk 2 includes a large number of cylinders 15 in which data is recorded, but for clarity, only one cylinder among the large number of cylinders 15 is illustrated in FIG. 1. A plurality of servo areas 15S are arranged in the cylinder 15 of the disk 2. In the first embodiment, information acquired from the servo area is referred to as servo information. In other words, servo information is data written in the servo area and data capable of being read from the servo area.

The head 9 includes a read head 9R and a write head 9W. The read head 9R reads data recorded in the cylinder 15 on the disk 2. Read data is, for example, user data and servo information. The write head 9W writes data onto the disk 2. Written data is, for example, user data.

The head amplifier IC 5 includes a read amplifier and a write driver. The read amplifier amplifies a read signal read by the read head 9R and delivers the read signal to a read/write (R/W) channel 16. The write driver transfers a write current in accordance with write data output from the R/W channel 16 to the write head 9W.

The main controller 6 includes the R/W channel 16, a hard disk controller (HDC) 17, and a processor 18, and is, for example, an integrated circuit. The main controller 6 may be configured with a single chip.

The R/W channel 16 includes a read channel 16R and a write channel 16W. The read channel 16R amplifies the read signal read by the read head 9R in the head amplifier IC 5 and processes the amplified signal to decode data (including servo information). The write channel 16W executes signal processing of write data from the HDC 17.

The read channel 16R includes a sample buffer memory 161 and a read buffer memory 162, but one or both of the sample buffer memory 161 and the read buffer memory 162 may be disposed external to the R/W channel 16.

Furthermore, the read channel 16R includes an error correction unit 163, a first determination unit 164, a second determination unit 165, and a scheduler 166. Although details of the error correction unit 163, the first determination unit 164, the second determination unit 165, and the scheduler 166 will be described later, at least one of these components may be implemented by, for example, the HDC 17 or the processor 18 without being included in the R/W channel 16, and therefore may be implemented as an independent component of storage device 1.

The HDC 17 controls data transfer between the host device 21 and the R/W channel 16. The HDC 17 controls the buffer memory 19 to store read data and write data temporarily in the buffer memory 19 so as to execute data transfer control. The buffer memory 19 may be, for example, a dynamic random access memory (DRAM). The HDC 17 may control a flash memory as an example of a non-volatile memory 20 used as, for example, a cache area for temporarily storing data.

The processor 18 is, for example, a central processing unit (CPU) or a micro processing unit (MPU), controls the VCM 11 through the driver IC 7, and executes positioning control (servo control) of the head 9. Furthermore, the processor 18 controls recording (also referred to as writing) and reproducing (also referred to as reading) of data through the R/W channel 16. The processor 18 may implement various functions according to the firmware.

In each cylinder 15 included in the disk 2, q servo areas 15S (where q is an integer number of 2 or more) are periodically arranged at regular circumferential intervals. Data areas 15D for recording user data are arranged between the servo areas 15S in the circumferential direction. Servo information is recorded in q servo areas SVF1 to SVFq. In such servo information, position information is divided into a plurality of segments of block information (also referred to as servo bursts) and the plurality of segments of block information are recorded in the servo areas SVF1 to SVFq. Servo information may be recorded in the servo areas SVF1 to SVFq without causing position information to be divided. Position information includes, for example, information for detecting at least one of a cylinder position, a track position, and a sector as the current position of the head 9. In the first embodiment, the sector is the minimum recording unit with respect to the disk 2. A plurality of servo areas SVF1 to SVFq are dispersed within the cylinder 15 to thereby make it possible to reduce a size of each of the servo areas SVF1 to SVFq, to increase a size of the data area 15D used for recording user data of each cylinder 15, and to enable the disk 2 to achieve a high recording density. A Sync-Mark detection error recovery of the first embodiment executed by the read channel 16R will now be described.

Figure 2:
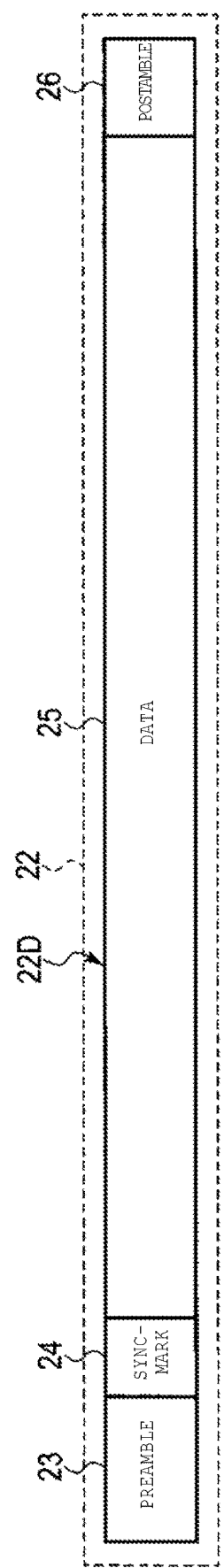
FIG. 2 is a conceptual diagram illustrating an example of a recording state of a sector which is not divided by a servo area.

FIG. 2 is a conceptual diagram illustrating an example of a sector 22 that is not divided by the servo area 15S. In FIG. 2, sector data 22D is recorded in the sector 22, and the sector 22 is not divided by the servo area 15S. Sector data 22 recorded in the sector 22 includes a preamble 23, a Sync-Mark 24, data 25, and a postamble 26. Data 25 includes user data and an error correcting code. The error correcting code may be located prior to or after data 25 in sector 22, and/or may be dispersed in a plurality of positions.

The preamble 23 is a signal for enabling synchronization when reading read data.

The Sync-Mark 24 is a code for detecting the beginning of data 25 when reading data.

The postamble 26 is a signal indicating the end of data 25.

The read channel 16R discretizes a continuous signal read from the disk 2 to generate a sample value (sampling), secures synchronization using the preamble 23, detects the beginning of data 25 using the Sync-Mark 24, and detects the end of data 25 using the postamble 26. In this way, the read channel 16R detects data 25.

Figure 3:
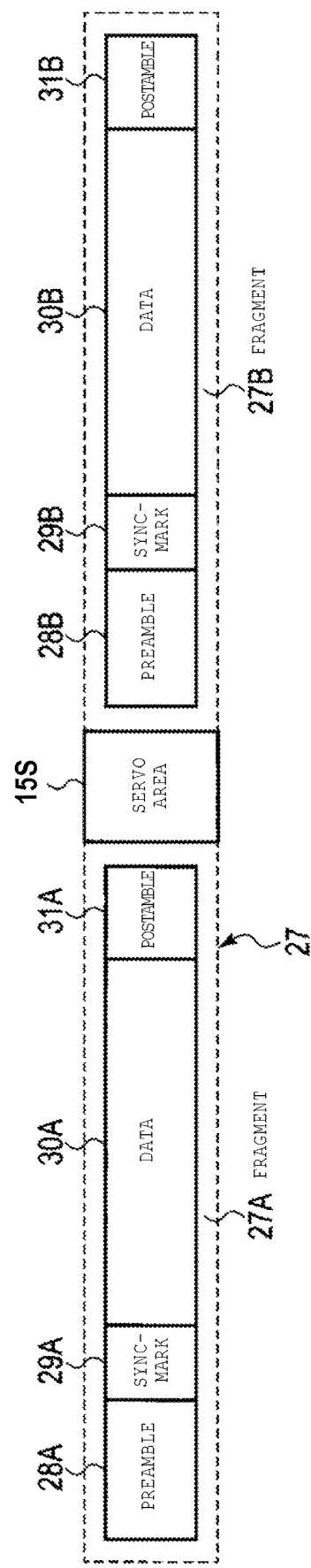
FIG. 3 is a conceptual diagram illustrating an example of a recording state of a split sector which is divided by a servo area.

FIG. 3 is a conceptual diagram illustrating an example of a split sector 27 which is divided by the servo area 15S.

As shown in FIG. 3, the split sector 27 is divided by the servo area 15S. Areas obtained by dividing the split sector 27 with the servo area 15S include a fragment 27A and a fragment 27B. In the fragment 27A, a preamble 28A, a Sync-Mark 29A, data 30A, and a postamble 31A are recorded. In the fragment 27B, a preamble 28B, a Sync-Mark 29B, data 30B, and a postamble 31B are recorded. As such, in the split sector 27, data is arranged in a pattern that straddles servo information, i.e., data in the split sector 27 is disposed before and after servo area 15S.

When the Sync-Marks 24, 29A, and 29B are not detected, for example, a recovery method referred to as a forcible search can be used.

Figure 4:
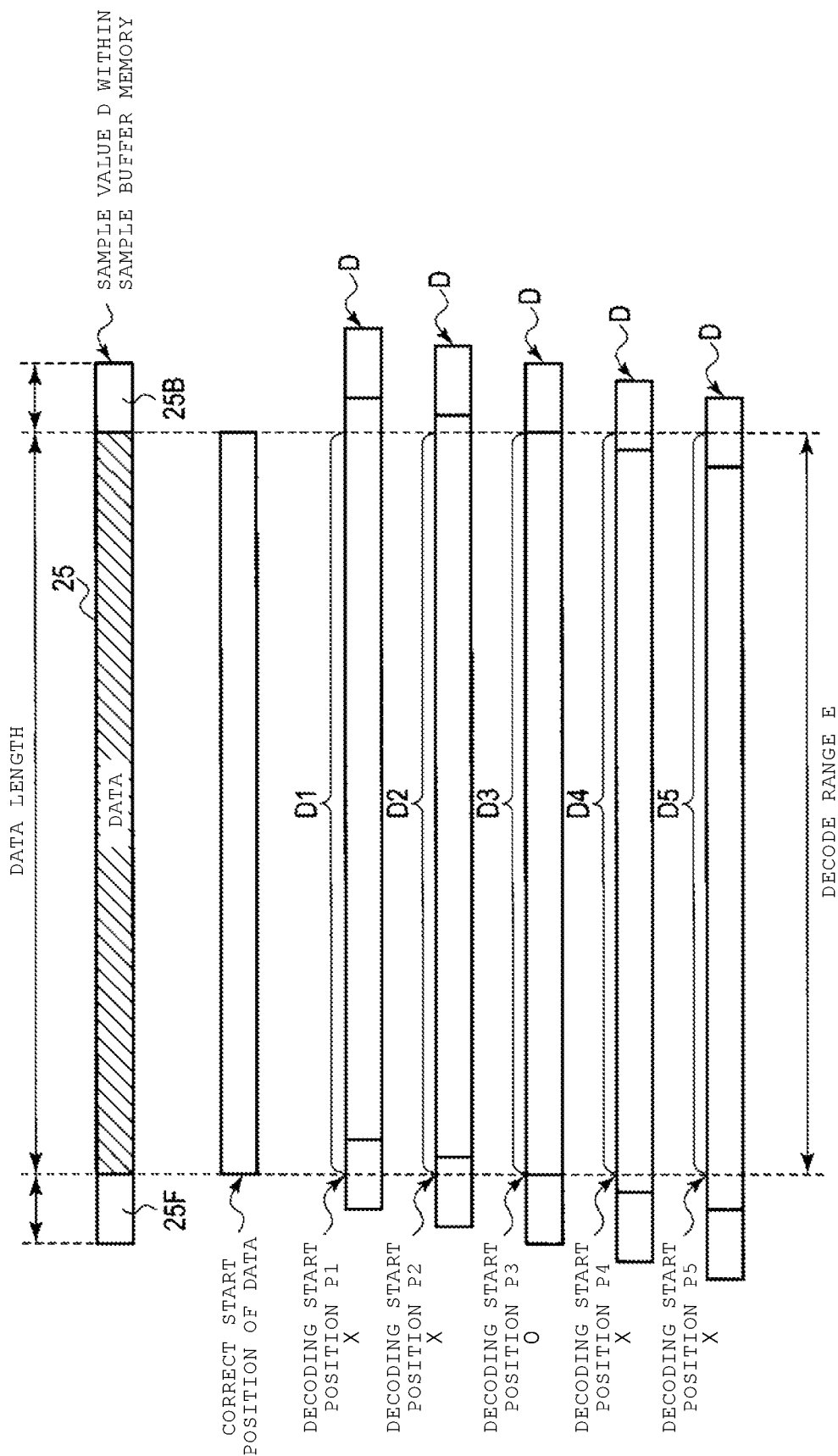
FIG. 4 is a conceptual diagram illustrating an example of a forcible search.

FIG. 4 is a conceptual diagram illustrating an example of a forcible search. Although a forcible search for decoding data 25 illustrated in FIG. 2 is used as an example in FIG. 4, a forcible search for decoding data other than data 30A or data 30B illustrated in FIG. 3, or the like is also similar to the forcible search for decoding data 25.

In a forcible search, the read channel 16R of the storage device 1 stores a sample value (in the form of a sample sequence) D acquired from a read target sector, in the sample buffer memory 161 irrespective of the presence or absence of Sync-Mark detection. The sample value D within a sample buffer memory 161 includes at least data 25 and data portions 25F and 25B which are not data 25 but are respectively disposed in the front and the rear of data 25. In other words, the sample value D includes data 25 and an extra value extended to the front (data portion 25F) and rear (data portion 25B) of data 25. An example of the extra value includes, for example, an end portion of the Sync-Mark 24, a beginning portion of the postamble 26, or the like.

The read channel 16R selects decoding target data in a decode range E from the sample buffer memory 161 while shifting a decoding start position from among the sample values D, and tries decoding of selected portions of the target data. Here, the decode range E is equal to a data length of read target data 25. In FIG. 4, five decoding start positions P1 to P5 are illustrated. Also illustrated are decoding target data segments D1 to D5, which respectively correspond to the decoding start positions P1 to P5.

The read channel 16R repeats operations described above until a start position for selected decoding target data (i.e., decoding target data segments D1 to D5) coincides with a correct start position of data 25. In the embodiment illustrated in FIG. 4, when decoding of decoding target data segment D3 corresponding to the decoding start position P3 is attempted, the forcible search is ended.

The decoding target data segments respectively start from decoding start positions P1, P2, P4, and P5, and have the same data length as a data length of data 25. When the decoding target data segments D1, D2, D4, and D5 are decoded, the parity violation number becomes greater than or equal to the threshold value. By contrast, when a piece of decoding target data that starts from the decoding start position P3 and has the same data length as the data length of data 25 is decoded, the parity violation number will be less than the threshold value. Thus, the sample value D including the extra value extending in the front and rear of the data length of decoding target data is acquired. Decoding is then repeated by shifting the decoding start positions of decoding target data from among the acquired sample values D to thereby enable detection of data 25 even when a read error of the Sync-Mark for data 25 has occurred.

As an example of one recovery method when a read error of a Sync-Mark is generated, a missing flag may be used when shifting the decoding start position after data having the data length of data 25 is stored in the sample buffer memory 161 as the sample value D. Specifically, the recovery method is a method for executing iterative decoding of decoding target data in which a missing flag is allocated to an incomplete portion (portion not stored in the sample buffer memory 161). The missing flag is generated when the decoding start position of decoding target data (i.e., one of decoding target data segments D1 to D5) stored in the sample buffer memory 161 is shifted.

Figure 5:
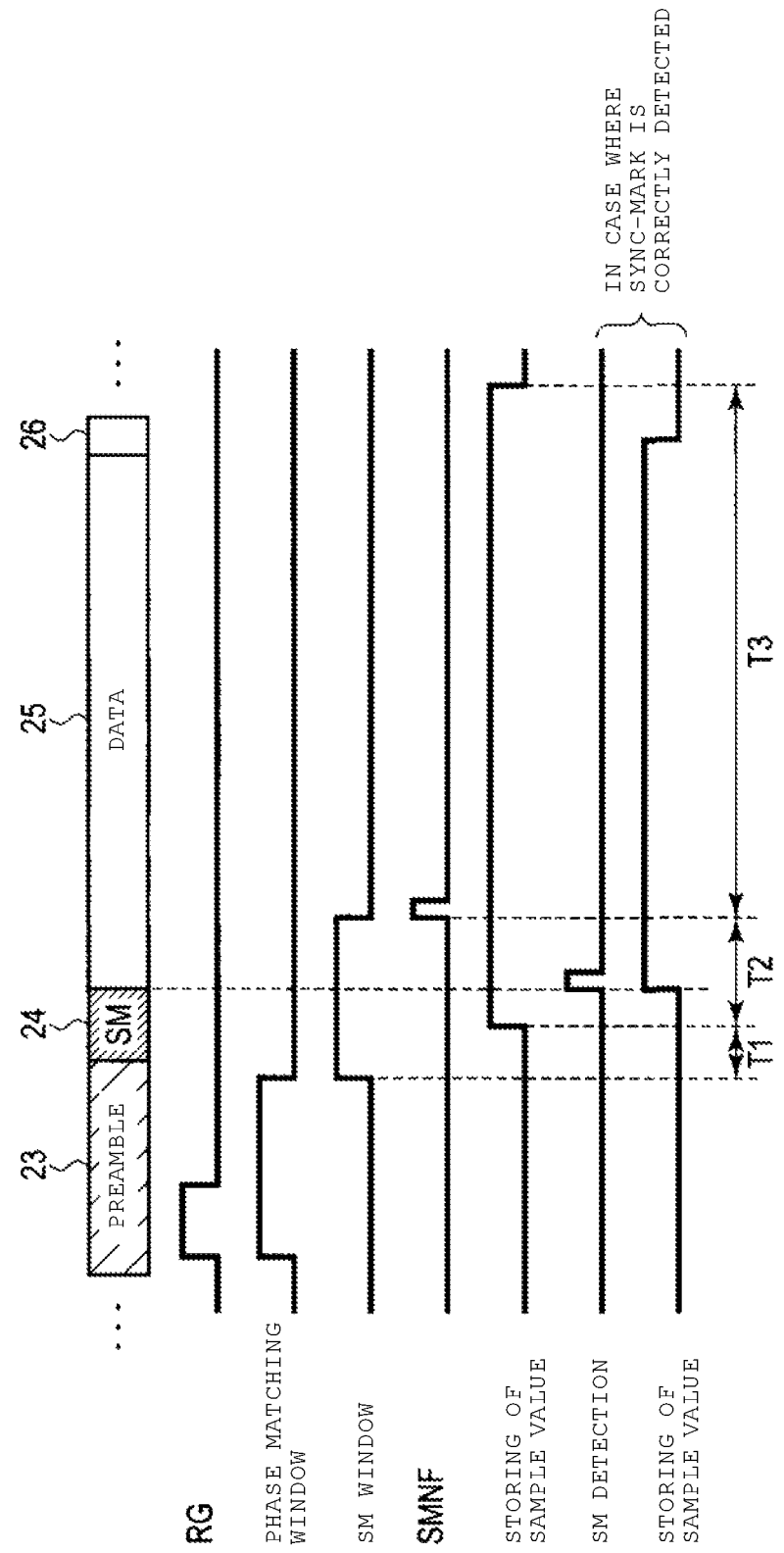
FIG. 5 is a timing chart illustrating an example of a sample value stored in order to conduct the forcible search by a read channel.

FIG. 5 is a timing chart illustrating an example of the sample value D stored in order to conduct the forcible search by the read channel 16R. In FIG. 5, although an active state and an inactive state are illustrated in HIGH and LOW, respectively, a relationship between the active and inactive states and HIGH and LOW may be reversed. The same is true with respect to the following description.

The read channel 16R stores the sample value D which is selected to be longer than a length of data 25 in the sample buffer memory 161 to ensure that data 25 is stored in the sample buffer memory 161.

When a read gate RG is changed from the inactive state to the active state, the read channel 16R starts reading of the disk 2.

The read channel 16R detects the preamble 23 while a phase matching window corresponding to a preamble is active, performs phase matching of a signal acquired from the preamble 23 detected by a PLL circuit (phase synchronization circuit) and an internal reference clock, and performs further phase matching when a phase and a frequency deviate. The phase matching will be described more specifically. Phase matching is generally executed in a period during which a first phase matching window and a second phase matching window are active. When the first phase matching window is active, the PLL circuit detects phase deviation using several samples and corrects phase deviation. However, the number of samples for detecting phase deviation is limited and thus, a correction residual error is generated. When the second phase matching window is active, the PLL circuit corrects the correction residual error using a feedback loop.

The read channel 16R performs detection of the Sync-Mark (SM in FIG. 5) while a Sync-Mark window corresponding to a Sync-Mark 24 is active.

If the Sync-Mark is not detected at the point in time when the Sync-Mark window is changed from active to inactive, the read channel 16R generates a signal (denoted by an SMNF signal in the example of FIG. 5) indicating that a Sync-Mark detection error has occurred.

The read channel 16R begins storing the sample value D in the sample buffer memory 151 at a point in time when a predetermined time interval T1 has elapsed since the Sync-Mark window is turned from inactive to active. The read channel 16R then stores the sample value D in the sample buffer memory 161 during a time interval T3 that elapses starting at a point in time when the Sync-Mark window is turned from active to inactive (search time-out of Sync-Mark). The sample value D stored during time interval T3 has a data length that corresponds to the data length of data 25. Here, the time interval T1 may also be, for example, a time interval that is equal to or less than a read time of the Sync-Mark. In this case, the read channel 16R stores the sample value D in the sample buffer memory 161 during a time interval T2 and a time interval T3 of FIG. 5, for example.

In the first embodiment, a range in which the sample value D is stored in the sample buffer memory 161 can be varied, as long as the length of sample value D ensures that data 25 is stored in the sample buffer memory 161.

For example, when the preamble is detected, the sample value D may begin to be stored in the sample buffer memory 161 at a point in time immediately after the preamble is detected.

For example, the read channel 16R may store the sample value D in the sample buffer memory 161 during the time interval T1, time interval T2, and time interval T3 of FIG. 5.

The read channel 16R may store the sample value D in the sample buffer memory 161, for example, during the time interval T3 and execute decoding while allocating the missing flag as needed. During time interval T3 a value of the data length of data 25 that is stored in the sample buffer memory 161 is from a point in time when the Sync-Mark window is turned from active to inactive until the end of the time interval T3.

When the Sync-Mark is correctly detected, the read channel 16R changes the Sync-Mark detection signal from inactive to active.

When the Sync-Mark detection signal is generated, the read channel 16R stores data 25 in the sample buffer memory 161 following the Sync-Mark 24.

In the forcible search described above, decoding is repeated for multiple iterations, while the decoding start position is shifted to correspond to the various sample values D (shown in FIG. 4) stored in the sample buffer memory 161. Accordingly, decoding time for the multiple decoding trial times may be needed and, a processing time for completing such iterative decoding is greater.

Particularly, for the split sector 27 illustrated in FIG. 3, when a plurality of Sync-Marks is included in the sample value D, multiple decoding trials/operations of both fragments 27A and 27B is conducted and thus, the number of decoding trial times equals the number of fragments times of the number of decoding trial times for one particular fragment. Consequently, the processing time increases.

In the first embodiment, a time required for one trial is shortened in a forcible search.

Figure 6:
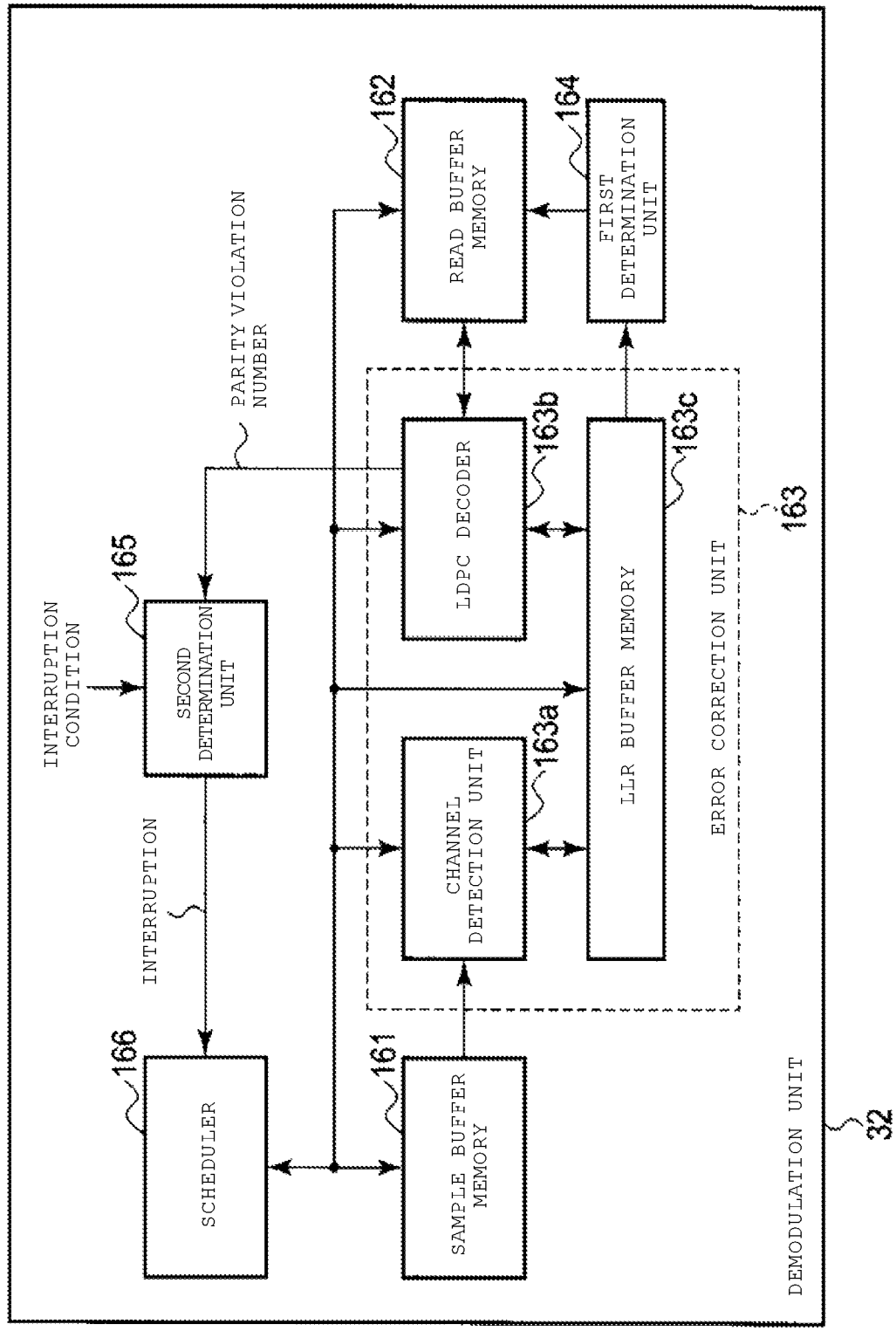
FIG. 6 is a block diagram illustrating an example of a configuration of a demodulation unit of the read channel according to the first embodiment.

FIG. 6 is a block diagram illustrating an example configuration of a demodulation unit 32 of the read channel 16R according to the first embodiment.

The demodulation unit 32 includes the sample buffer memory 161, the read buffer memory 162, the error correction unit 163, the first determination unit 164, the second determination unit 165, and the scheduler 166 that are described above. The error correction unit 163 includes a channel detection unit 163a, a low-density parity check (LDPC) decoder 163b, and a log-likelihood ratio (LLR) buffer memory 163c.

The scheduler 166 executes control of the sample buffer memory 161, the channel detection unit 163a, the LLR buffer memory 163c, the LDPC decoder 163b, and the read buffer memory 162, and controls Sync-Mark detection error recovery.

In the first embodiment, the scheduler 166 notifies the channel detection unit 163a of decoding target data within the decode range E among the sample values D stored in the sample buffer memory 161.

In the error correction unit 163, an error correction using, for example, an LDPC code, is executed using the channel detection unit 163a and the LDPC decoder 163b.

In the first embodiment, the channel detection unit 163a reads a sample value of the decode range E, which is designated as the digital signal from the scheduler 166, as decoding target data from the sample buffer memory 161.

The LDPC decoder 163b is an example of an error correcting code (ECC) decoder. The LDPC decoder 163b executes an error correction (LDPC decoding) using the LDPC code. In the first embodiment, the LDPC decoder 163b notifies the second determination unit 165 of the parity violation number of the decoding target data generated via LDPC decoding of the decoding target data. The LLR buffer memory 163c stores LLR data obtained as a result of channel detection processing executed by the channel detection unit 163a. LLR data is information exchanged between the channel detection unit 163a and the LDPC decoder 163b, and is used for LDPC decoding.

When the error correction is completed by the error correction unit 163, the first determination unit 164 reads LLR data stored in the LLR buffer memory 163c. The first determination unit 164 detects binary data configured with "0" or "1" based on the LLR data read from the LLR buffer memory 163c, and stores detected binary data in the read buffer memory 162.

The second determination unit 165 receives an interruption condition from, for example, the processor 18. The interruption condition is information used for interrupting the forcible search and executing another recovery. In the first embodiment, when the parity violation number is received from the LDPC decoder 163b and the parity violation number is greater than or equal to a threshold value designated by the interruption condition, the second determination unit 165 notifies the scheduler 166 of information (for example, sets a flag) indicating that decoding is to be interrupted.

When information indicating that the forcible search is to be interrupted is received from the second determination unit 165, the scheduler 166 stops decoding executed by the error correction unit 163, determines the next decoding target data, and notifies the channel detection unit 163a of the next decoding target data.

When a start position of data 25 of the read target sector is different from an expected original position in the sample value D stored in the sample buffer memory 161, association between the parity and data collapses. Hence, the parity violation number becomes a significantly greater parity violation number compared to an instance of normal ECC error detection and ECC error correction. In this scenario, the parity violation number is not decreased, even when decoding is performed on sample data D.

In light of the above, in the first embodiment, the second determination unit 165 interrupts decoding when it is determined that the parity violation number is obviously an abnormal value. Instead, the second determination unit 165 reads new decoding target data (for example, any of D1 to D5 of FIG. 4) from the sample buffer memory 161, according to the next offset value, and tries decoding. The offset value is position information specifying decoding target data for which decoding is to be attempted among the sample values D stored in the sample buffer memory 161.

When multiple parity violation numbers, which are calculated by causing decoding to be repeated a plurality of times, satisfy a predetermined condition (or a predetermined pattern), the second determination unit 165 may determine that decoding is to be interrupted and may notify the scheduler 166 of interruption of decoding.

Specifically, the second determination unit 165 may determine that decoding is to be repeated when a parity violation number that is repeatedly calculated has a pattern indicating a tendency to decrease, and may determine that decoding is to be stopped when the parity violation number that is repeatedly calculated has a pattern indicating an tendency to increase.

When a predetermined parity violation number that is continuously calculated is maintained at a predetermined level or more, the second determination unit 165 may determine that decoding is to be stopped.

The second determination unit 165 may set a parity violation number that is calculated by causing decoding of particular read target data to be repeatedly calculated as a first group, may set at least one parity violation number calculated by causing decoding of the particular read target data to be repeated at least once, after decoding is repeatedly calculated, as a second group, and may determine, based on the result obtained from a comparison of the first group and the second group, whether or not decoding is to be interrupted. As a specific example of the comparison, the second determination unit 165 may obtain, for example, a change rate obtained by dividing a total value or an average value of the first group by a total value or an average value of the second group, may determine that decoding is to be repeated when the change rate is less than the threshold value, and may determine that decoding is to be interrupted when the change rate is greater than or equal to the threshold value. More simply, the second determination unit 165 may obtain, for example, a difference obtained by subtracting the total value or the average value of the second group from the total value or the average value of the first group; may determine that decoding is to be repeated when the difference is greater than or equal to the threshold value; and may determine that decoding is to be interrupted when the difference is less than the threshold value.

Here, although the description is of the comparison of the first group and the second group, the second determination unit 165 may determine whether decoding is to be stopped or not based on a result of comparison between three or more groups.

Thus, the condition that decoding trials for the sample value D is to be interrupted can be based on various conditions.

Determination of whether decoding is to be interrupted or not is made based on whether the parity violation number is greater than or equal to the threshold value. Alternatively or additionally, determination of whether decoding is to be interrupted or not is made based on the pattern (indicating a tendency to increase or decrease) of the plurality of parity violation numbers generated for the sample D may be used.

Here, processing that returns from the LDPC decoder 163b to the channel detection unit 163a is referred to as global iteration and processing that is repeated within the LDPC decoder 163b is referred to as local iteration.

Generally, the time required for process of one trial is obtained by the relation: (processing time of LDPC decoder 163b×number of local repetitions+time for one sector)× number of global repetitions is. In the first embodiment, local repetition is interrupted to thereby enable advancement to a next trial in a reduced time, i.e., the processing time of LDPC decoder 163b×1+time for one sector. Here, the time for one sector is a time interval during which one sector in one track is passed over by the head 9, and may be a different value at different radial positions of the disk 2. The example of the comparison of processing time is an example, and an actual processing time may further depend on a circuit configuration of the demodulation unit 32, or the like.

Figure 7:
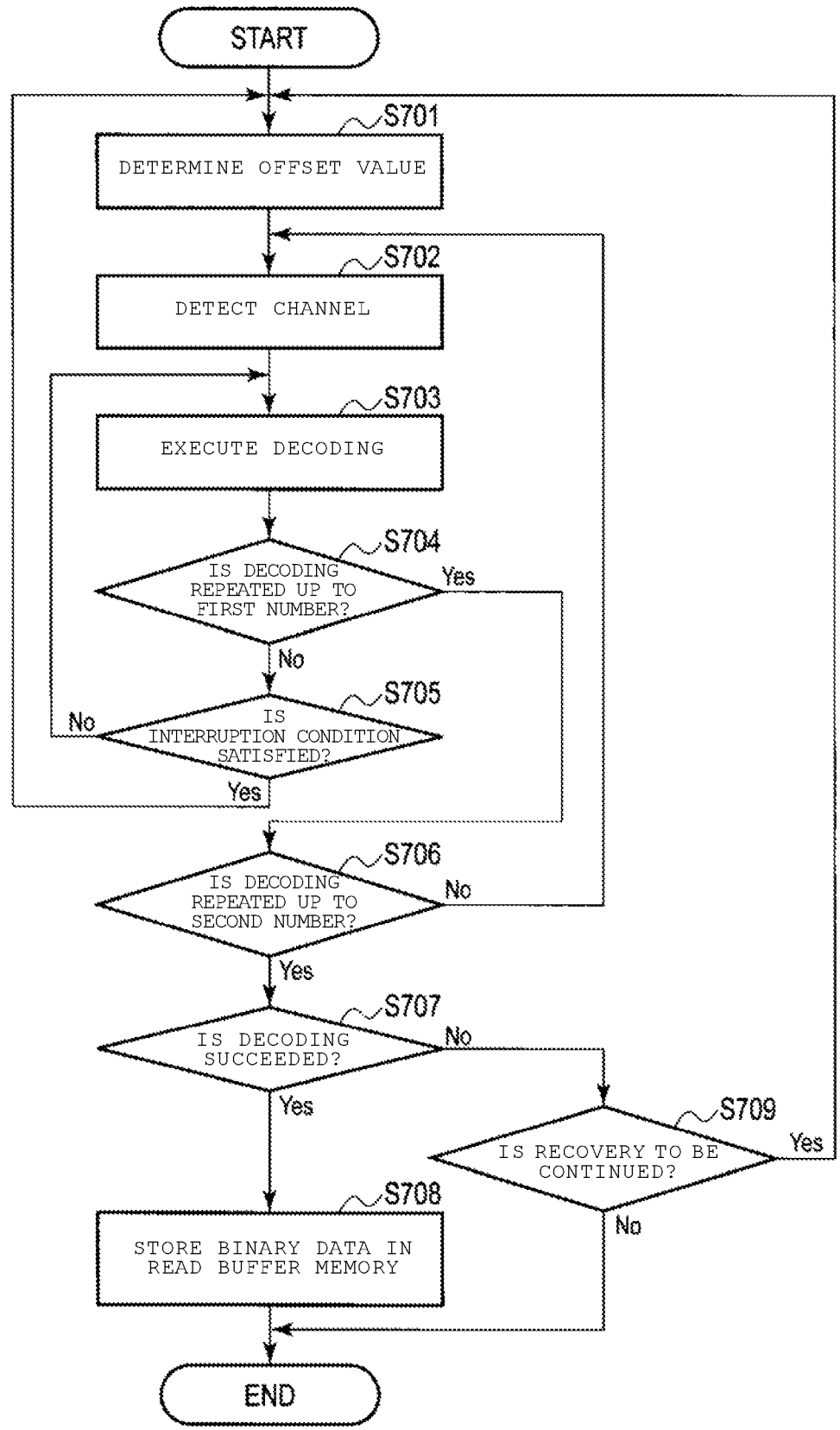
FIG. 7 is a flowchart illustrating an example of processing executed by the demodulation unit according to the first embodiment.

FIG. 7 is a flowchart illustrating an example of processing executed by the demodulation unit 32 according to the first embodiment.

In S701, the scheduler 166 determines the offset value and instructs the channel detection unit 163a to execute decoding.

In S702, the channel detection unit 163a reads decoding target data within the decode range E from the sample buffer memory 161. The channel detection unit 163a reads the decoding target data from the position that is designated by the offset value from the scheduler 166. The channel detection unit 163a then executes channel detection processing, and stores LLR data in the LLR buffer memory 163c.

In S703, the LDPC decoder 163b executes LDPC decoding of LLR data stored in the LLR buffer memory 163c and updates LLR data of the LLR buffer memory 163c.

In S704, the scheduler 166 determines whether LDPC decoding of decoding target data is repeated up to a first number or not, such as a maximum iteration number. When it is determined that LDPC decoding of decoding target data is repeated up to the first number (Yes in S704), processing proceeds to S706. Processing from a point in time when LDPC decoding of decoding target data is started to a point in time when it is determined that LDPC decoding is repeated up to the first number is referred to as first iterative processing. First iterative processing corresponds to the local iterative process described above.

When it is determined that LDPC decoding of decoding target data is not repeated up to the first number (No in S704), in S705, the scheduler 166 determines whether the result of LDPC decoding in S703 satisfies an interruption condition or not. When the interruption condition is satisfied (Yes in S705), processing returns to S701, and when the interruption condition is not satisfied (No in S705), processing returns to S703.

When it is determined that LDPC decoding of decoding target data is repeated up to the first number in S704 (Yes in S704), in S706, the scheduler 166 determines whether processing from a point in time when channel detection processing is executed in S702 to a point in time when it is determined that LDPC decoding is repeated up to the first number in S704 is repeated up to a second number or not. Processing from the point in time when channel detection processing is executed to the point in time when it is determined that LDPC decoding is repeated up to the first number is referred to as second iterative processing. Second repetitive processing corresponds to global iteration described above.

If second iterative processing is not completed (No in S706), processing returns to S702. If second repetitive processing is completed (Yes in S706), in S707, the scheduler 166 determines whether the decoding result satisfies (decode success condition is met) the condition or not.

When it is determined that decoding satisfies the condition (Yes in S707), in S708, the first determination unit 164 determines that the LLR data of the LLR buffer memory 163c is binary data, and stores binary data from the result of the determination in the read buffer memory 162.

When decoding fails (No in S707), in S709, the scheduler 166 determines whether to continue recovery by the forcible search or not. When it is determined that recovery is not to be continued (No in S709), processing is ended. After the processing of FIG. 7 is ended, another recovery method other than forcible search may be executed. When it is determined that recovery by the forcible search is to be continued (Yes in S709), processing returns to S701. Thereafter, the scheduler 166 determines the next offset value in S701, the channel detection unit 163a executes channel detection processing based on the next offset value in S702, and the LDPC decoder 163b updates LLR data of the LLR buffer memory 163c by the above-described first repetitive processing.

In the processing of FIG. 7 described above, the first repetitive processing is included in the second repetitive processing. In the first embodiment, when it is determined that the interruption condition is satisfied, such as for example, when the parity violation number is greater than or equal to the threshold value, decoding of current decoding target data is interrupted, processing continues to S701, and the scheduler 166 changes the offset value in S701. In this way, processing in S702 and succeeding steps are executed again for new decoding target data.

As for the forcible search of the first embodiment, when the interruption condition is satisfied, the forcible search is interrupted. For example, the forcible search is interrupted when the parity violation number is greater than or equal to the threshold value, and when a plurality of parity violation numbers do not have a pattern indicating a tendency to decrease.

For that reason, it is possible to shorten the execution time of a forcible search to be less than the timed needed for performing all possible trials of a forcible search, thereby shortening a recovery time for the storage device 1.

In forcible search, reading of decoding target data from the sample buffer memory 161 is repeated and further, decode processing of decoding target data is repeated. However, in the first embodiment, it is possible to interrupt decoding iterations of decoding target data in the middle of the decoding process. Thus, it is possible to reduce the number of execution times of decode processing.

Second Embodiment

In the second embodiment, a method is described in which a value indicating a time from a read reference position to a Sync-Mark detection position is stored, or the like, a Sync-Mark detection position is determined based on the stored value, an offset value is determined based on a learning result, and the determined offset value is used for the forcible search. Here, the read reference position indicates a position associated with respect to a read operation.

In the second embodiment, in the forcible search, recovery is performed on decoding target data having a high possibility of being subjected to recovery so as to shorten a recovery time of the storage device. The second embodiment can be applied by being combined with the first embodiment described above.

For example, variation in timing during the write process may be generated by a variation in position of the disk 2 in the radial direction, and variation in timing at which the read head 9R reads data during the read process may be generated by component jitter or other mechanical disturbances. Consequently, a storage device is generally required to be able to recover read data irrespective of the presence or absence of variation in write time and read time.

In the second embodiment, decoding target data with an offset value that is determined based on past data from which the Sync-Mark was able to be detected is set as a condition for executing decoding.

Figure 8:
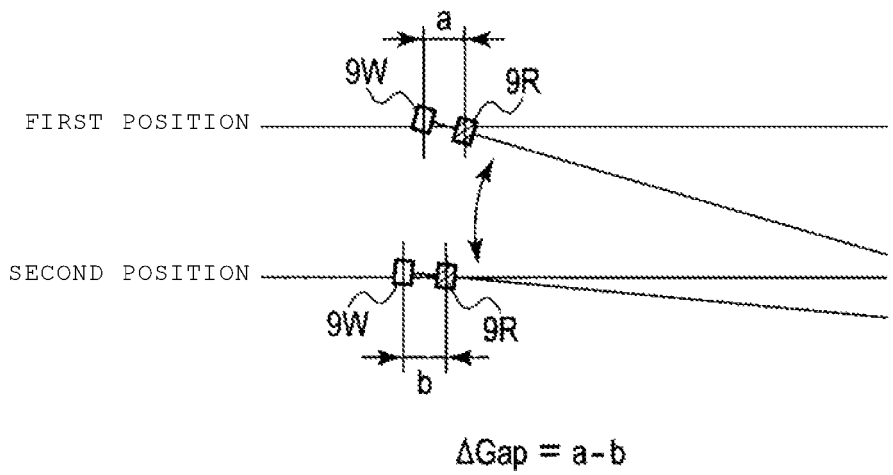
FIG. 8 is a conceptual diagram illustrating an example of a state where a distance between a write head and a read head in a circumferential direction of a disk varies according to a Yaw angle.

FIG. 8 is a conceptual diagram illustrates how a distance between the write head 9W and the read head 9R in a circumferential direction of the disk 2 varies according to a Yaw angle.

The Yaw angle is an inclination angle of the head 9 with respect to the circumferential direction of the disk 2. A distance between the write head 9W and the read head 9R in the circumferential direction of the disk 2 varies by the Yaw angle. Specifically, in the first position, the distance between the write head 9W and the read head 9R in the circumferential direction of the disk 2 equals circumferential distance a. In the second position, the distance between the write head 9W and the read head 9R in the circumferential direction of the disk 2 equals circumferential distance b. A gap ΔGAP is generated between the circumferential distance a and the circumferential distance b. As a result, a relative position between the read reference position and the Sync-Mark may differ as a function of the current position of the head 9 in the radial direction of the disk 2.

The forcible search range can be widened so that a possibility of detecting the position of data 25 is increased even when the data position is varies due to the Yaw angle. However, when the forcible search range is widened, an amount of decoding target data to be selected is increased, and processing time is increased accordingly.

In the second embodiment, even when the data position is varies due to the Yaw angle, optimization of the position for which the forcible search is to be performed is achieved. In the second embodiment, a search is performed from a position close to data 25 to reduce the processing time required until recovery is successful.

Figure 9:
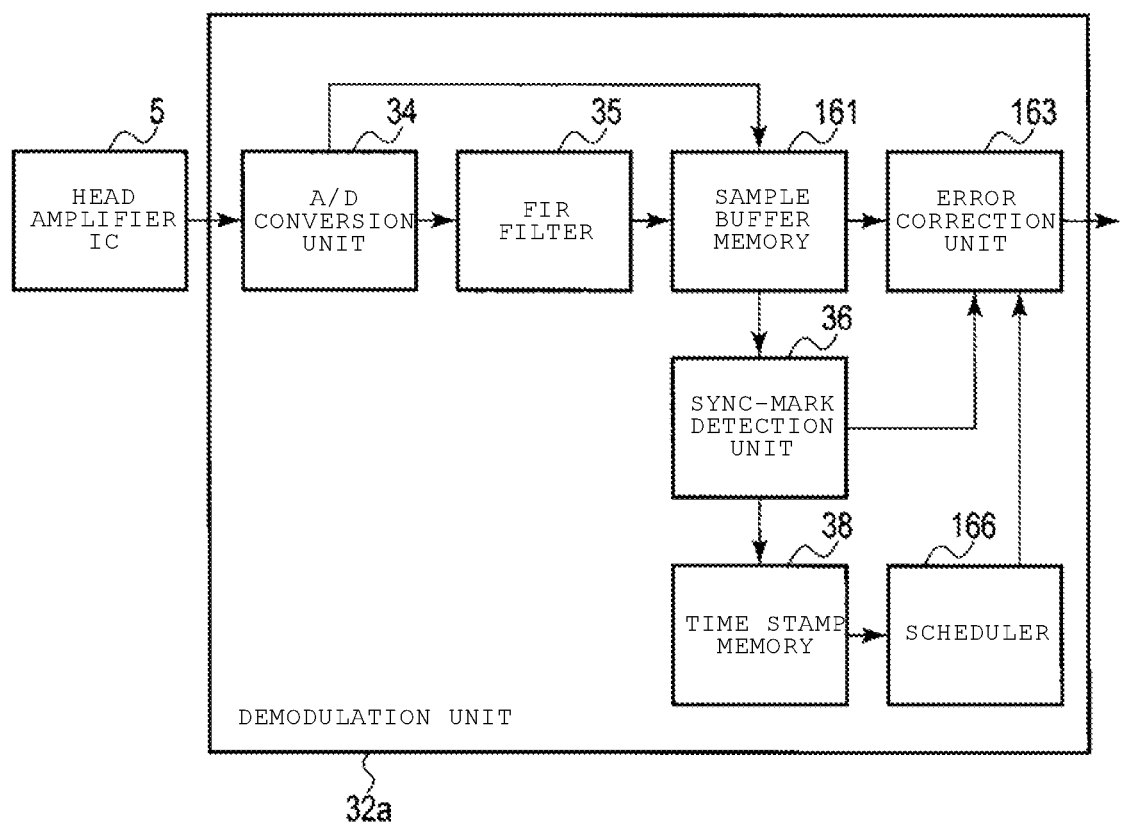
FIG. 9 is a block diagram illustrating an example of a configuration of a demodulation unit of a read channel according to a second embodiment.

FIG. 9 is a block diagram illustrating an example configuration of a demodulation unit 32a of the read channel 16R according to a second embodiment.

In the second embodiment, a start (initial) offset value (position) of the forcible search is determined using previously acquired data. The previously acquired data includes position information with respect to the disk 2 for read target data that have been read normally, such as data read from a sector for which the Sync-Mark has been normally detected. The sector for which the Sync-Mark has been normally detected may be located proximate a sector included in the current read target data.

The demodulation unit 32a includes an A/D conversion unit 34, a finite impulse response (FIR) filter 35, the sample buffer memory 161, a Sync-Mark detection unit 36, the error correction unit (iterative decoder) 163, a time stamp memory 38, and the scheduler 166.

The A/D conversion unit 34 receives an analog signal from the head amplifier IC 5, converts the analog signal into a digital signal, and transmits the digital signal to the FIR filter 35.

The FIR filter 35 performs filtering of the digital signal received from the A/D conversion unit 34 and stores the resultant signal in the sample buffer memory 161 as a sample value.

The Sync-Mark detection unit 36 reads the sample value stored in the sample buffer memory 161, detects a Sync-Mark position (for example, Sync-Mark detection timing) from the read reference position (for example, read reference timing), and transmits the detected Sync-Mark position to the error correction unit 163. Furthermore, the Sync-Mark detection unit 36 stores the position information (for example, sector position) of the disk 2 and a value (in the following, referred to as a time stamp) of the Sync-Mark position in the time stamp memory 38. When stored in the time stamp memory 38, the position information (sector position) the value (time stamp) of the Sync-Mark position are stored in association with each other. The time stamp is a value indicating a position of a portion of previous read target data, where the portion of previous read target data is detected from a past sample value that was stored at a point in time prior to the point in time when the current sample value D is stored in the sample buffer memory 161. The Sync-Mark detection unit 36 may store only a single time stamp or multiple time stamps in the time stamp memory 38 that are associated with a particular sector position or position information of the disk 2.

The error correction unit 163 reads the sample value D from the sample buffer memory 161, receives the Sync-Mark detection position from the Sync-Mark detection unit, and acquires data 25 included in the sample value D. The error correction unit 163 performs the error correction of data 25 by LDPC decoding, or the like.

When the Sync-Mark cannot be detected by the Sync-Mark detection unit 36, the scheduler 166 determines the start offset value of the forcible search based on the time stamp associated with position information of the disk 2 of the read target stored in the time stamp memory 38, and notifies the error correction unit 163 of the start offset value. For example, when multiple time stamps are associated with position information for the read target in the time stamp memory 38, the scheduler 166 may determine an average value or a median value of the multiple time stamps for use as the start offset value.

The time stamp memory 38 stores position information of the disk 2 and the time stamp in association with each other as described above. The scheduler 166 may determine the start offset value corresponding to the position of the read target based on one or more time stamps associated with position information closest to the position (for example, the sector position) of the read target.

Figure 10:
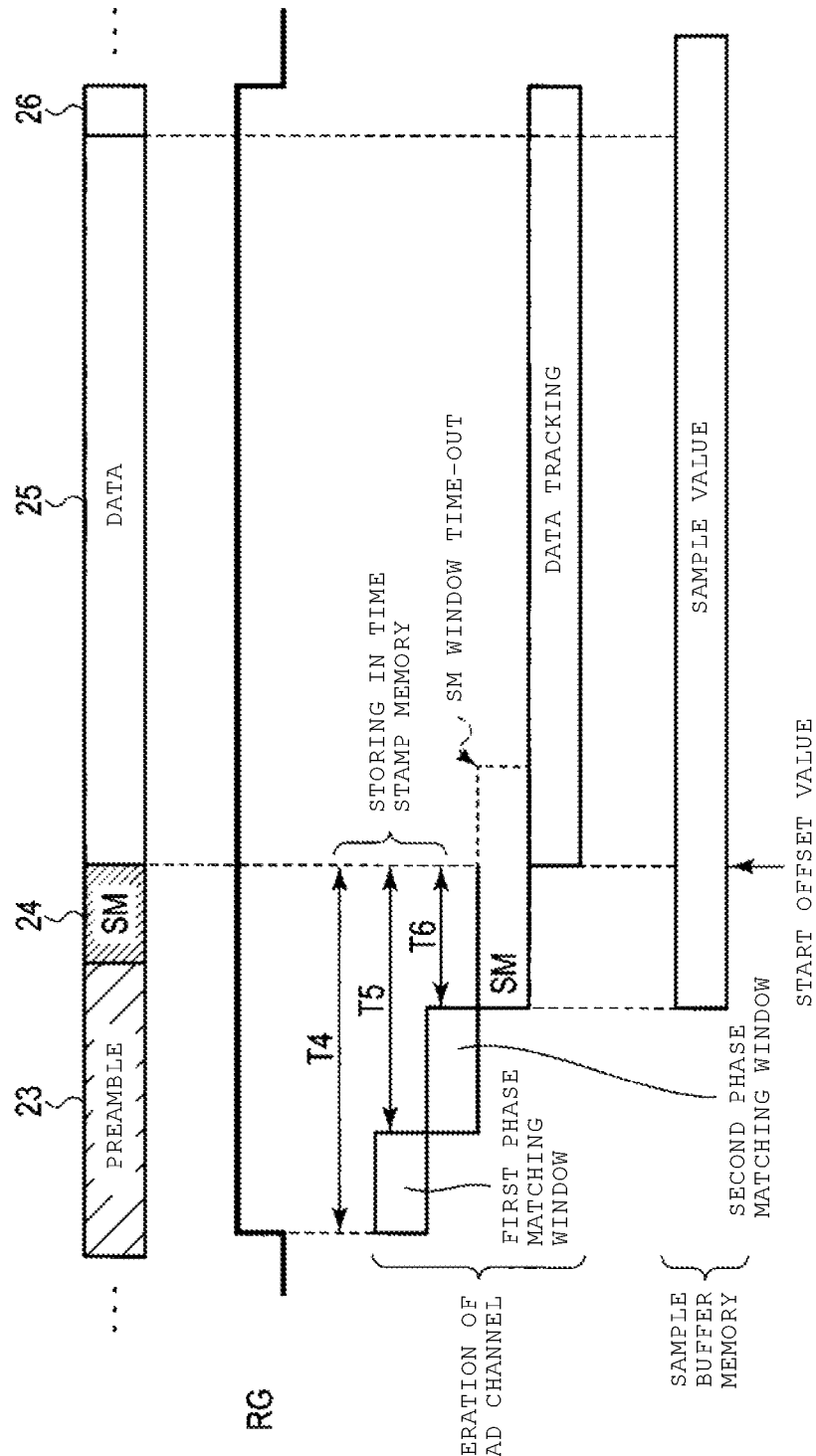
FIG. 10 is a timing chart illustrating an example of a relationship between a start offset value and a first to third examples of a Sync-Mark detection position stored in a time stamp memory.

FIG. 10 is a timing chart illustrating a relationship between a start offset value and first, second, and third examples of a Sync-Mark detection position stored in the time stamp memory 38.

In FIG. 10, when the read gate RG is active, the read channel 16R operates. A first phase matching window and a second phase matching window are each similar in function to the phase matching window of FIG. 5 described above. The read channel 16R performs phase matching of signals in a time interval during which the first phase matching window is active, and then performs further phase matching when phases of the signals deviate in a time interval during which the second phase matching window is active. The read channel 16R detects the Sync-Mark in the time interval between a start point of the Sync-Mark window to a time-out point of the Sync-Mark window, and starts data tracking when the Sync-Mark is detected.

The start offset value can be calculated using various types of read reference positions. For example, the start offset value may be set as a time interval T4 that begins at a start point of an active period of the read gate RG; a time interval T5 that begins at a completion point of an active period of the first phase matching window of the PLL circuit; and a time interval T6 that begins at a completion point of an active period of the second phase matching window of the PLL circuit, among others. These particular start offset values are merely examples and may be changed as appropriate.

In the second embodiment, the beginning position of the sample value D stored in the sample buffer memory 161 for recovery may be based on, for example, one or more of the various read reference positions described above. In the example of FIG. 10, a case is illustrated in which the sample value D begins to be stored in the sample buffer memory 161 starting at the completion point of the active period of the second phase matching window, or the starting point of the Sync-Mark window. However, the time at which storing of the sample value D into the sample buffer memory 161 is started may instead be a time that ensures that data 25 can be stored in the sample buffer memory 161. For example, in some embodiments, the storing of the sample value D into the sample buffer memory 161 is started at the completion point of the active period of the first phase matching window or the start point of the active period of the second phase matching window.

Figure 11:
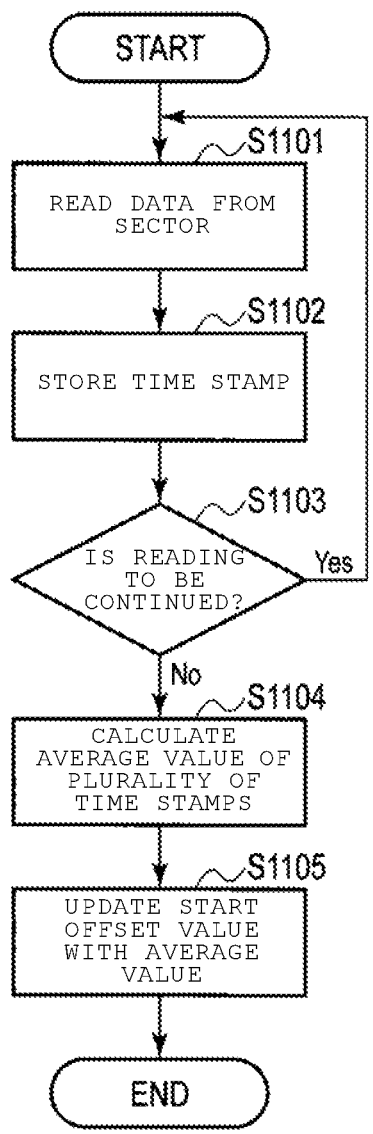
FIG. 11 is a flowchart illustrating an example of processing for updating the start offset value based on a time stamp stored in the time stamp memory.

FIG. 11 is a flowchart illustrating an example process for updating the start offset value based on a time stamp stored in the time stamp memory 38.

In S1101, the read channel 16R reads data from a sector.

In S1102, the Sync-Mark detection unit 36 stores the time stamp indicating the Sync-Mark position that is correctly detected in the reading of data in S1101 and position information (sector position) of the disk 2 in the time stamp memory 38. The time stamp and the position information are stored in the time stamp memory 38 in association with each other.

In S1103, the scheduler 166 determines whether reading is to be continued or not. When it is determined that reading is to be continued (Yes in S1103), the process returns to S1101. When it is determined that reading is not to be continued (No in S1103), the process proceeds to S1104.

As described above, variation can occur in the write time and the read time. For that reason, it is preferable to obtain an optimum value for the Sync-Mark position by, for example, averaging. In a situations where there is no need to perform optimization, the scheduler 166 may read only one time stamp stored in the time stamp memory 38.

In S1104, the scheduler 166 calculates an average value of one or more time stamps associated with position information in the time stamp memory 38 to perform optimization.

In S1105, the scheduler 166 updates (i.e., changes) the start offset value used for the forcible search with the calculated average value.

Thereafter, the process proceeds to the forcible search (Sync-Mark detection error recovery).

Figure 12:
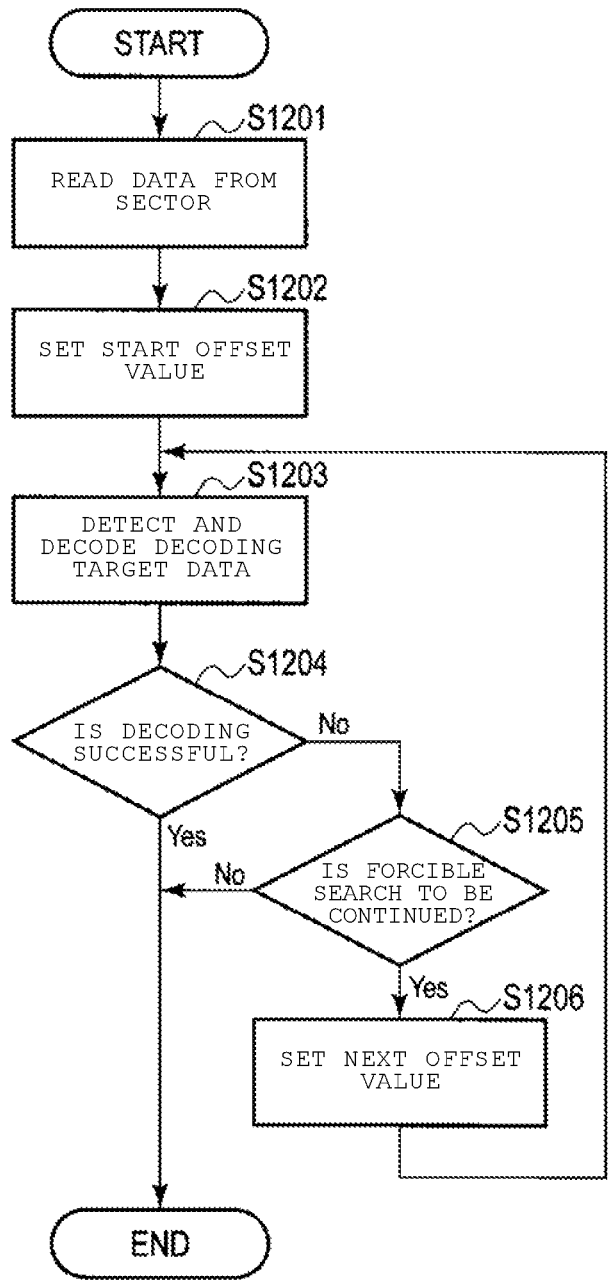
FIG. 12 is a flowchart illustrating an example of a forcible search.

FIG. 12 is a flowchart illustrating an example of a forcible search process.

In S1201, the read channel 16R reads data from a sector.

In S1202, the scheduler 166 sets the start offset value updated in S1105 of FIG. 11 as the offset value used for reading out decoding target data from the sample buffer memory 161.

In S1203, the error correction unit 163 reads out decoding target data from the sample buffer memory 161 to perform decoding of target data according to the set offset value.

In S1204, the scheduler 166 determines whether decoding satisfies the condition (is successful) or not.

When the decoding condition is satisfied (Yes in S1204), the process ends. When the decoding does not satisfy the decoding condition (i.e., fails) (No in S1204), in S1205, the scheduler 166 determines whether the forcible search is to be continued or not.

When it is determined that the forcible search is not to be continued (ended) (No in S1205), the process ends. When it is determined that the forcible search is to be continued (Yes in S1205), in S1206, the scheduler 166 sets the next offset value as the offset value used for reading out decoding target data from the sample buffer memory 161. The scheduler 166 may determine a value that is shifted from the current offset value by a predetermined value, for example, as the next offset value. The offset value may be selected from among a plurality of remaining offset values that have not yet been employed for the decoding target data. The scheduler 166 may determine the next offset value so that, for example, a difference between the start offset value and the next offset value is gradually increased.

As described above, in the second embodiment, the start offset value is calculated from the time stamp which is the value of the correctly detected Sync-Mark position and the forcible search is executed by preferentially using the start offset value and a value that is proximate the start offset value, such as an offset value that is shifted from or slightly different than the start offset value.

In the second embodiment, in order to reduce the effect of the Yaw angle described previously, it is preferable to calculate the start offset value based on the time stamp corresponding to the same cylinder as a recovery target or a cylinder adjacent to the recovery target. In the second embodiment, in order to reduce variation in the write time and variation in the time generated when the read head 9R reads data, the number of samples of the time stamp associated with a particular sector position or position information of the disk 2 is increased. An average value of the multiple time stamps is then calculated so that the start offset value selected is close to the center of variation between the time stamps, and the average value is used as the start offset value. Thus, averaging of the time stamps is performed to thereby make it possible to obtain the optimum start offset value of the forcible search, for example, even when variation in the data position is caused by the Yaw angle. Accordingly, in the second embodiment, there is no need to try the forcible search across a wide range of offset values to account for such variation, and it is possible to determine the start position of read target data 25 in a short time.

As described above, in the second embodiment, the start offset value of the recovery target sector may be calculated using, for example, previously determined results relating to one or more sectors adjacent to the recovery target sector (for example, collecting or averaging of time stamps). In this case, it is possible to calculate a suitable start offset value for the recovery target sector using the previously determined results for one or more sectors adjacent to the recovery target sector. Calculating the start offset value in this way can be beneficial even when where the number of samples of the time stamps for the recovery target sector is small. Furthermore, for example, in each sector, even when the optimum number of times that decoding target data is extracted from the sample buffer memory 161 (in other words, a range in which a forcible search is executed with respect to the sample value D stored in the sample buffer memory 161) is different in the forcible search, it is possible to determine the optimum number of times decoding target data is extracted from the sample buffer memory 161 for the recovery target sector using the time stamp of the recovery target sector or a sector meeting a certain condition. For example, the time stamp of the sector that is located adjacent to the recovery target sector can be used. Accordingly, in the second embodiment, it is possible to shorten a period of time (learning time) for determining a suitable start offset value for the recovery target sector and for determining the suitable number of times decoding target data is extracted from the sample buffer memory 161.

Calculation of the start offset value may be executed each time the time stamp is stored in the time stamp memory 38. The start offset value may be calculated by successively storing the time stamps in the time stamp memory 38 and then computing an average value of the time stamps.

In the second embodiment, although the start offset value is described being calculated based on the Sync-Mark position, the start offset value may be also calculated based on other position data by which a correct position of decoding target data can be specified.

Third Embodiment

In the third embodiment, a method for reducing a forcible search time is described when the offset value is shifted in the forcible search. The forcible search time is reduced by making a shift amount (in the following, referred to as a step size) to have a value that is a natural multiple of one period of a period pattern included in a data pattern of the preamble 23. In the following, the periodic pattern included in the data pattern of the preamble 23 will be referred to simply as the periodic pattern of the preamble 23. N periods of the periodic pattern of the preamble 23 (where n is an integer number of 1 or more) will be referred to as an n pattern period. The third embodiment can be implemented in conjunction with one or both of the first embodiment and the second embodiment. In the third embodiment, decoding target data that is acquired based on the shift amount corresponding to the n patterns is set as a condition for executing decoding.

Figure 13:
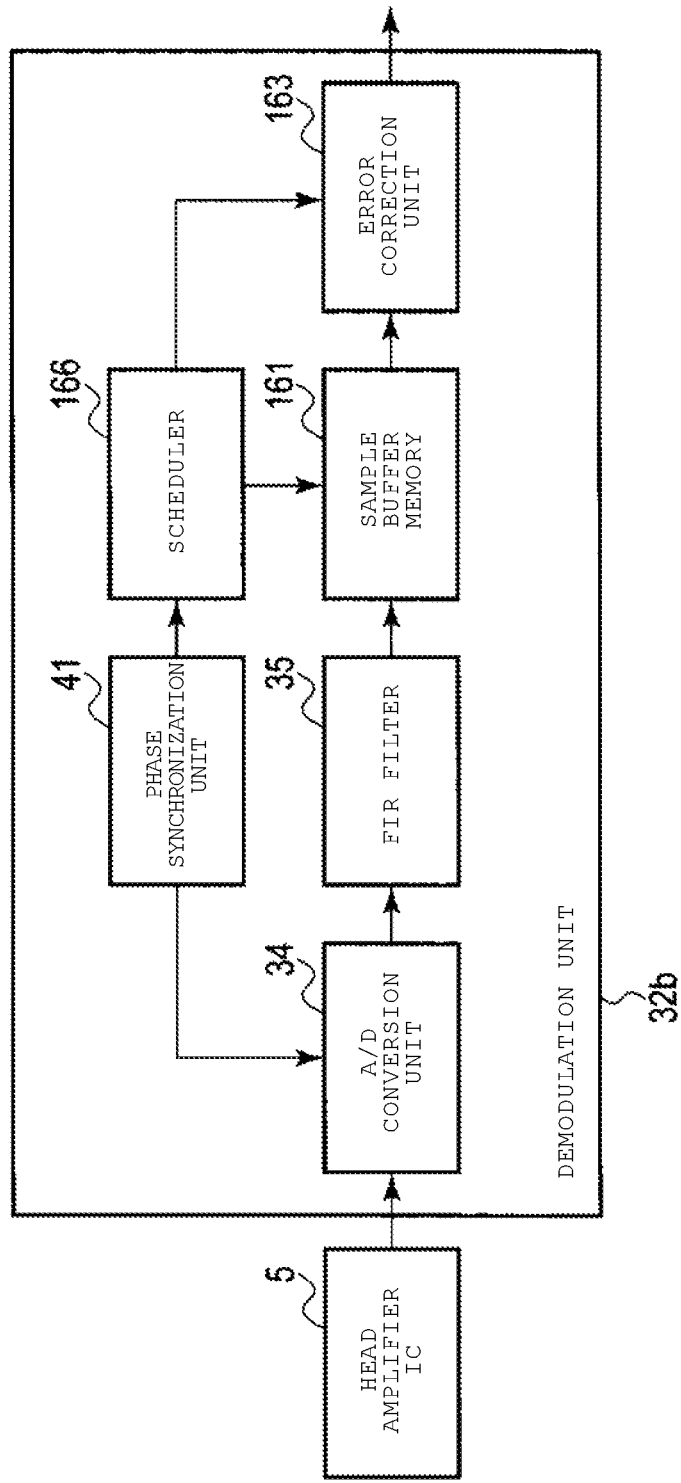
FIG. 13 is a block diagram illustrating an example of a configuration of a demodulation unit of a read channel according to a third embodiment.

FIG. 13 is a block diagram illustrating an example configuration of a demodulation unit 32b of the read channel 16R according to a third embodiment.

A demodulation unit 40 includes, for example, the A/D conversion unit 34, the FIR filter 35, the sample buffer memory 161, the error correction unit 163, the phase synchronization unit 41, and the scheduler 166.

The A/D conversion unit 34 transmits a digital signal to the FIR filter 35 and the phase synchronization unit 41.

The phase synchronization unit 41 transmits a control signal of which a phase is synchronized with the preamble 23 included in the digital signal transmitted from the A/D conversion unit 34 to the scheduler 166.

In the third embodiment, for example, a length of the Sync-Mark 24 is determined to be a length of a natural number multiple of one pattern period of the preamble 23 as a storing format. With this, the starting position of data 25 appears after the end of the preamble 23 by a multiple of one pattern period of the preamble 23.

Accordingly, the scheduler 166 controls the forcible search in such a way that the forcible search is executed while being shifted by a unit of one pattern period of the preamble 23.

Figure 14:
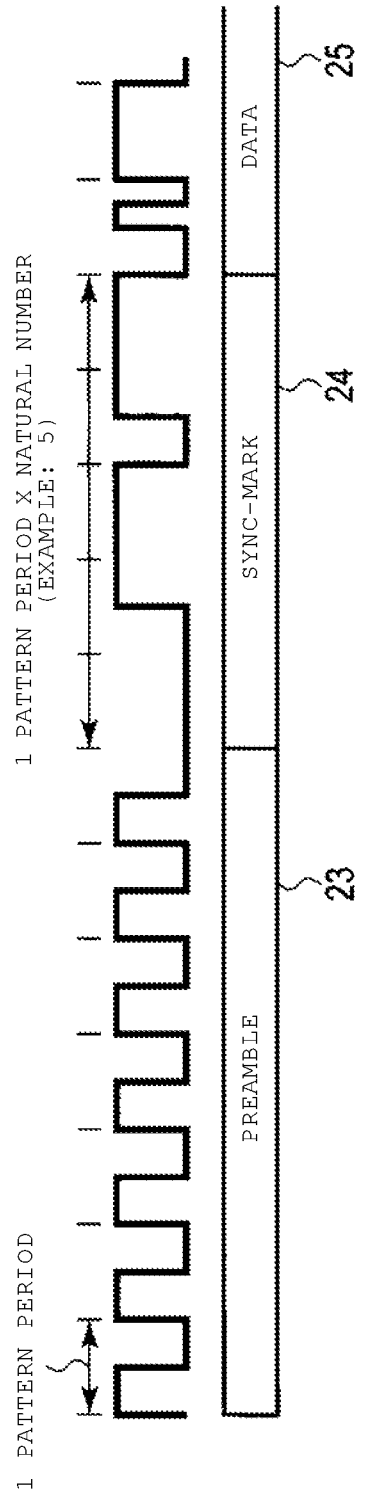
FIG. 14 is a timing chart illustrating an example of a relationship between one period of a period pattern of a preamble and a start position of data included in a data pattern.

FIG. 14 is a timing chart illustrating an example of a relationship between a pattern period of the preamble 23 and a start position of data 25. In FIG. 14, an embodiment is illustrated in which the beginning of data is located five pattern periods of the preamble 23 after the preamble 23 ends. In other words, in the embodiment illustrated in FIG. 14, the Sync-Mark 24 has a length equivalent to five pattern periods of the preamble 23.

The read channel 16R starts reading by matching a sampling phase with a pattern period of the preamble 23, and matching the period pattern of the preamble with the timing of the PLL circuit at a read start time. The read channel 16R then stores the sample value D in the sample buffer memory 161. In this case, when a pattern corresponding to the period pattern of the preamble 23 is stored in the sample buffer memory 161 during a time interval from the read start time to a completion time of an active period of the second phase matching window, the initial bit of data 25 appears in the position of one pattern period×n after the preamble 23, where n is an integer number of 1 or more.

In the third embodiment as described above, it is possible to set the step size of the forcible search in units of pattern periods of the preamble 23, reduce the number of decoding trial times, and reduce the time required for recovery. Specifically, by setting the step size of the forcible search in units of pattern periods of the preamble 23 in the third embodiment, there is no need to take into consideration variation in the read timing in the recovery trial range of the Sync-Mark, variation in the write time, and variation in the change between inside and outside of a zone into consideration. For example, for a method in which recovery is performed by shifting the offset value by one bit, it is possible to perform the search of data 25 by the forcible search in ¼ the time in the preamble 23 having a 4T period generally used (such as repetition of "0011" and "1100").

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a recording medium;
a first memory that stores first data read from the recording medium; and
a controller circuit configured to search for read target data in the first data by:
retrieving, as second data, a portion of the first data beginning at a first offset from a head position of the first data and having a length of the read target data,
executing a parity check on the second data,
while executing the parity check on the second data by repeatedly decoding the second data a predetermined number of times, counting a total number of parity violations each time the second data is decoded, and interrupting the parity check executed on the second data when the counted total number of parity violations is greater than or equal to a threshold,
storing the second data in a second memory when the parity check executed on the second data completes and the decoding of the second data is successful, and
retrieving, as third data, a portion of the first data beginning at a second offset from the head position and having the length of the read target data, and executing a parity check on the third data either when the parity check executed on the second data is interrupted or when the parity check executed on the second data completes and the decoding of the second data is not successful.

2. The storage device according to claim 1, wherein
the first data read from the recording medium includes a preamble including a plurality of pattern periods and a sync-mark having a length equal to a natural number multiple of the length of one pattern period of the preamble, and
the first and second offsets differ by one pattern period of the preamble.

3. The storage device according to claim 1, wherein
the parity check includes a low-density parity check (LDPC) that is repeatedly executed a number of times, and the total number of parity violations is counted for each execution of the LDPC.

4. The storage device according to claim 1, wherein
the first data read from the recording medium includes a sync-mark that is arranged in front of the read target data and is used for detection of the read target data, and
the controller circuit executes the parity check on the second data when an error occurs in detecting the sync-mark.

5. The storage device according to claim 1, wherein
at least one value that indicates a position of previously read target data is stored in a third memory, and
the controller extracts the second data from the first data based on the at least one value.

6. The storage device according to claim 5, wherein
the first data read from the recording medium includes a preamble including one or more pattern periods and a sync-mark having a length equal to a natural number multiple of the length of one pattern period of the preamble, and
the first and second offsets differ by one pattern period of the preamble.

7. The storage device according to claim 5, wherein
the first data read from the recording medium includes a sync-mark that is arranged in front of the read target data and is used for detection of the read target data, and
the controller circuit executes the parity check on the second data when an error occurs in detecting the sync-mark.

8. The storage device according to claim 1, wherein
a plurality of values that indicates positions of previously read target data is stored in a third memory, and
the controller extracts the second data from the first data based on an average value of the plurality of values.

9. The storage device according to claim 8, wherein
the first data read from the recording medium includes a preamble including a plurality of pattern periods and a sync-mark having a length equal to a natural number multiple of the length of one pattern period of the preamble, and
the first and second offsets differ by one pattern period of the preamble.

10. The storage device according to claim 8, wherein
the first data read from the recording medium includes a sync-mark that is arranged in front of the read target data and is used for detection of the read target data, and
the controller circuit executes the parity check on the second data when an error occurs in detecting the sync-mark.

11. A controller comprising:
an interface circuit that stores first data in a first memory; and
a demodulation circuit configured to search for target data in the first data by:
retrieving, as second data, a portion of the first data beginning at a first offset from a head position of the first data and having a length of the target data,
executing a parity check on the second data,
while executing the parity check on the second data by repeatedly decoding the second data a predetermined number of times, counting a total number of parity violations each time the second data is decoded, and interrupting the parity check executed on the second data when the counted total number of parity violations is greater than or equal to a threshold,
storing the second data in a second memory when the parity check executed on the second data completes and the decoding of the second data is successful, and
retrieving, as third data, a portion of the first data beginning at a second offset from the head position and having the length of the target data, and executing a parity check on the third data either when the parity check executed on the second data is interrupted or when the parity check executed on the second data completes and the decoding of the second data is not successful.

12. The controller according to claim 11, wherein
the first data read includes a preamble including a plurality of pattern periods and a sync-mark having a length equal to a natural number multiple of the length of one pattern period of the preamble, and
the first and second offsets differ by one pattern period of the preamble.

13. The controller according to claim 11,
the parity check includes a low-density parity check (LDPC) that is repeatedly executed a number of times, and the total number of parity violations is counted for each execution of the LDPC.

14. The controller according to claim 11, wherein
the first data read includes a sync-mark that is arranged in front of the target data and is used for detection of the target data, and
the demodulation circuit executes the parity check on the second data when an error occurs in detecting the sync-mark.

15. A method of searching for read target data in first data that is read from a recording medium, the method comprising:
retrieving, as second data, a portion of the first data beginning at a first offset from a head position of the first data and having a length of the read target data;
executing a parity check on the second data;
while executing the parity check on the second data by repeatedly decoding the second data a predetermined number of times, counting a total number of parity violations each time the second data is decoded, and interrupting the parity check executed on the second data when the counted total number of parity violations is greater than or equal to a threshold;
storing the second data in a second memory when the parity check executed on the second data completes and the decoding of the second data is successful; and
retrieving, as third data, a portion of the first data beginning at a second offset from the head position and having the length of the read target data, and executing a parity check on the third data either when the parity check executed on the second data is interrupted or when the parity check executed on the second data completes and the decoding of the second data is not successful.

16. The method of claim 15, wherein
the parity check includes a low-density parity check (LDPC) that is repeatedly executed a number of times, and the total number of parity violations is counted for each execution of the LDPC.

17. The method of claim 15, further comprising:
searching for a sync-mark in the first data, wherein
the parity check is executed on the second data when an error occurs during the searching for the sync-mark in the first data.

* * * * *